United States Patent
Lu et al.

(10) Patent No.: US 9,513,316 B2
(45) Date of Patent: Dec. 6, 2016

(54) SYSTEM AND METHOD FOR A CAPACITIVE VOLTAGE SENSOR SYSTEM

(71) Applicant: General Electric Company, Schenectady, NY (US)

(72) Inventors: Dan Tho Lu, Minden, NV (US); Prabhakar Neti, Nisyakuna, NY (US)

(73) Assignee: General Electric Company, Schenectady, NY (US)

( * ) Notice: Subject to any disclaimer, the term of this patent is extended or adjusted under 35 U.S.C. 154(b) by 125 days.

(21) Appl. No.: 13/907,551

(22) Filed: May 31, 2013

(65) Prior Publication Data

US 2014/0354302 A1 Dec. 4, 2014

(51) Int. Cl.
*G01R 19/00* (2006.01)
*G01R 27/26* (2006.01)
*G01R 15/16* (2006.01)

(52) U.S. Cl.
CPC ........... *G01R 19/0084* (2013.01); *G01R 15/16* (2013.01); *G01R 27/2605* (2013.01)

(58) Field of Classification Search
CPC .................. G01R 27/2605; G01R 19/0084
USPC ............... 324/92–132, 72–76, 538–730, 378–424, 324/750–771
See application file for complete search history.

(56) References Cited

U.S. PATENT DOCUMENTS

| | | | | |
|---|---|---|---|---|
| 5,017,859 A | * | 5/1991 | Engel et al. | 324/127 |
| 5,473,244 A | * | 12/1995 | Libove | G01R 1/22 |
| | | | | 324/126 |
| 5,710,512 A | * | 1/1998 | Kondo et al. | 324/402 |
| 6,411,108 B1 | * | 6/2002 | Douglas et al. | 324/658 |
| 6,677,743 B1 | * | 1/2004 | Coolidge et al. | 324/126 |
| 7,265,533 B2 | * | 9/2007 | Lightbody et al. | 324/126 |
| 7,397,233 B2 | * | 7/2008 | Sorensen | 324/76.11 |
| 7,550,960 B2 | * | 6/2009 | Barbour et al. | 324/72.5 |
| 2010/0283487 A1 | * | 11/2010 | Juds et al. | 324/688 |
| 2013/0293218 A1 | * | 11/2013 | Levesque | 324/96 |

\* cited by examiner

*Primary Examiner* — Son Le
*Assistant Examiner* — Akm Zakaria
(74) *Attorney, Agent, or Firm* — Fletcher Yoder, P.C.

(57) ABSTRACT

A system including a non-intrusive capacitive voltage sensor configured to couple to an insulator surrounding a metal conductor, wherein the non-intrusive capacitive voltage sensor is configured to produce a voltage signal indicative of a voltage in the metal conductor, and a monitor-controller system configured to receive the voltage signal from the non-intrusive capacitive voltage sensor, wherein the monitor-controller system is configured to use the voltage signal to monitor or control a machine.

20 Claims, 5 Drawing Sheets

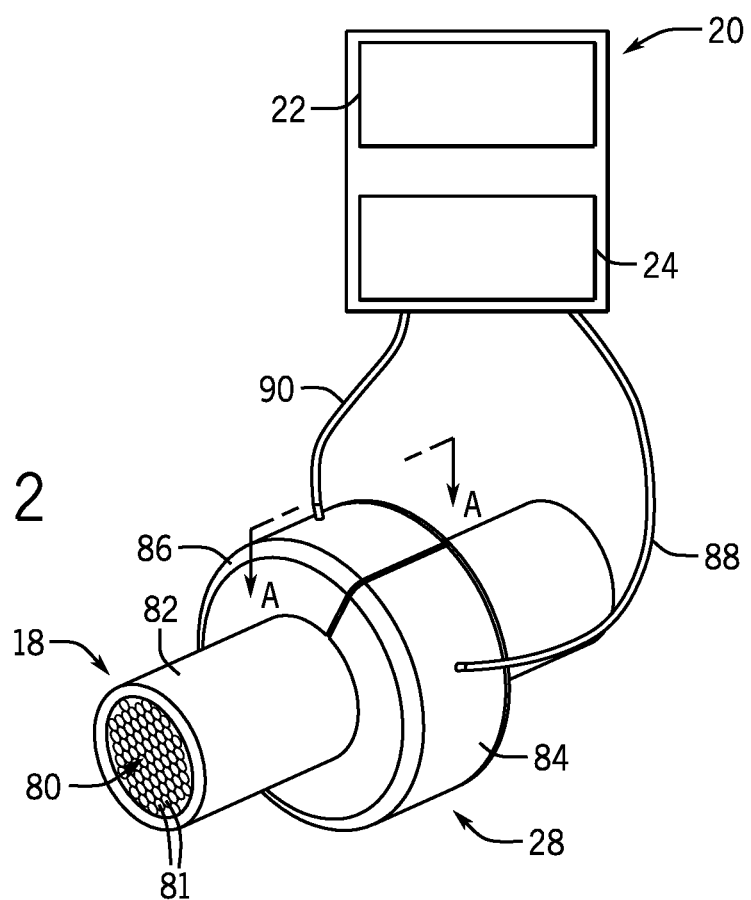

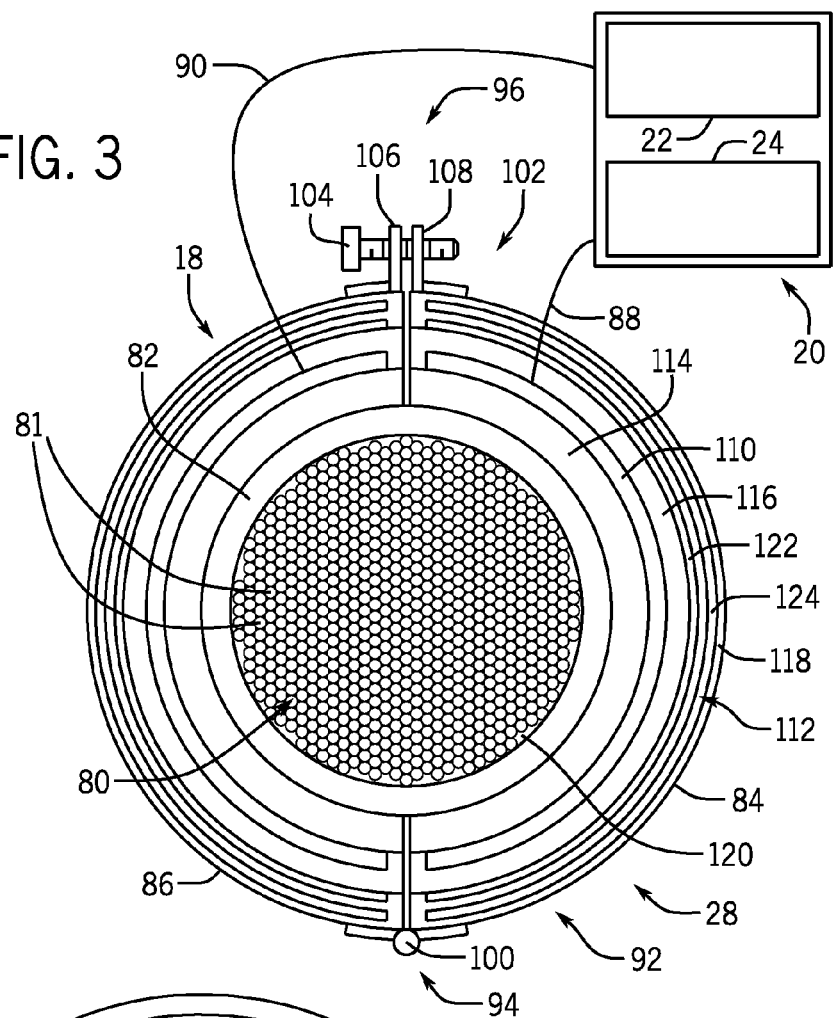
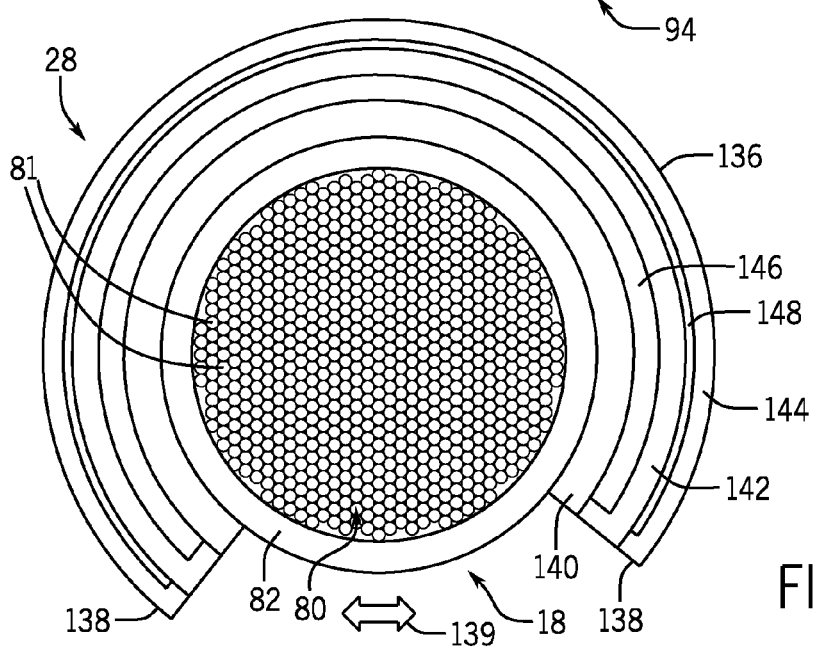

SYSTEM AND METHOD FOR A CAPACITIVE VOLTAGE SENSOR SYSTEM

BACKGROUND OF THE INVENTION

The subject matter disclosed herein relates to a system and method for a capacitive voltage sensor system.

Electric motors and generators use electromagnetic fields to either perform mechanical work or create electricity. The power produced by the generator or used by the motor passes through voltage lines covered in a non-conductive insulation. Accordingly, measurement of the voltage in the voltage line involves removing the insulation to provide direct access to the conductor. This process may be time consuming and expensive to perform.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system including a non-intrusive capacitive voltage sensor configured to couple to an insulator surrounding a metal conductor, wherein the non-intrusive capacitive voltage sensor is configured to produce a voltage signal indicative of a voltage in the metal conductor, and a monitor-controller system configured to receive the voltage signal from the non-intrusive capacitive voltage sensor, wherein the monitor-controller system is configured to use the voltage signal to monitor or control a machine.

In a second embodiment, a system including a first non-intrusive capacitive voltage sensor configured to output a first voltage signal indicative of a voltage in a metal conductor including a first signal plate configured to sense the voltage in the metal conductor, a first shield plate extending over the first signal plate, wherein the first shield plate is configured to block electromagnetic interference, and a second non-intrusive capacitive voltage sensor coupled to the first non-intrusive capacitive voltage sensor and configured to output a second voltage signal indicative of the voltage in the metal conductor including a second signal plate configured to sense the voltage in the metal conductor, a second shield plate extending over the second signal plate, wherein the second shield plate is configured to block electromagnetic interference.

In a third embodiment, a system including a non-intrusive capacitive voltage sensor configured to output a voltage signal to a monitor, wherein the voltage signal is indicative of a voltage in a metal conductor, the non-intrusive capacitive voltage sensor includes a signal plate configured to sense the voltage in the metal conductor, and a shield plate extending over the signal plate, wherein the shield plate is configured to block electromagnetic interference.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 2 is a perspective view of an embodiment of the non-intrusive capacitive voltage sensor coupled to an insulator surrounding a conductor;

FIG. 3 is a cross-sectional view of an embodiment of a capacitive voltage sensor;

FIG. 4 is a cross-sectional view of an embodiment of a capacitive voltage sensor;

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure is generally directed towards a non-intrusive capacitive voltage sensor system capable of non-intrusively sensing a voltage indicative of voltage in a voltage line. The non-intrusive capacitive voltage sensor is capable of attaching to the voltage line without removing the insulation surrounding the voltage line. In fact, the non-intrusive capacitive voltage sensor may non-intrusively attach (e.g., without removing or piercing the insulation) to the voltage line with an adhesive, a clip, a latch, a clamp, a strap, or other removable or permanent mount. Accordingly, the non-intrusive capacitive voltage sensor reduces the time and cost associated with monitoring voltage on a voltage line. In operation, the non-intrusive capacitive voltage sensor couples to a controller-monitoring system to provide the controller-monitoring system with a voltage (i.e., a voltage signal) indicative of voltage in the voltage line. The controller-monitoring system may use the voltage signal from the non-intrusive capacitive voltage sensor to monitor and/or control an electrical rotating machine.

Figure 1:
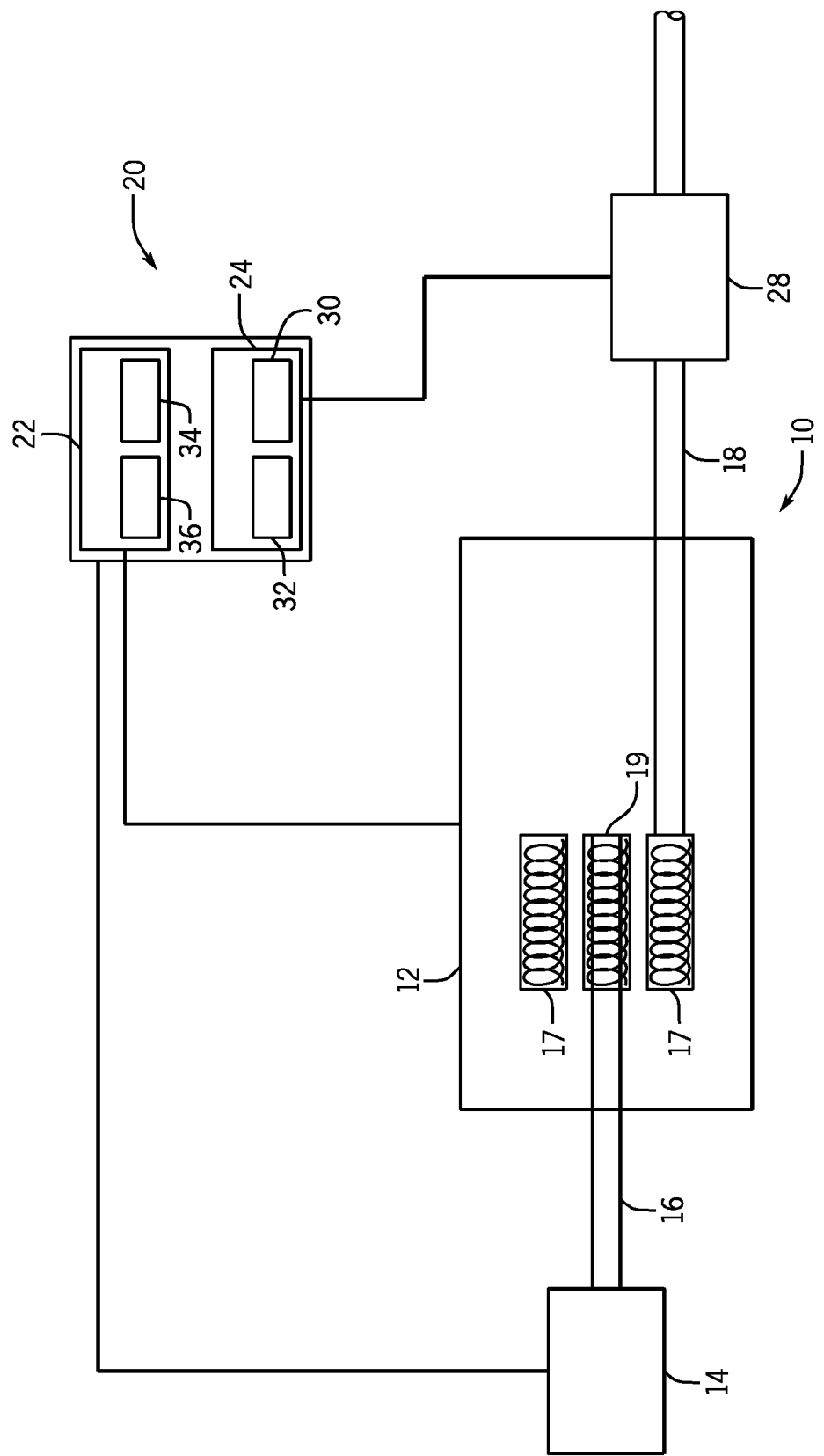
FIG. 1 is a schematic of an embodiment of a non-intrusive capacitive voltage sensor system.

FIG. 1 is an embodiment of a non-intrusive capacitive voltage sensor system 10. The non-intrusive capacitive voltage sensor system 10 may couple to an electrical rotating machine 12 (e.g., an electrical generator or electric motor) that couples to machinery 14 with a shaft 16. In some embodiments, the machinery 14 may include an internal combustion engine (e.g., a piston-type engine), a turbine engine (e.g., a gas turbine engine, a wind turbine, a steam turbine, a hydro turbine, or any combination thereof), or another drive that produces torque to drive shaft 16. The electrical rotating machine 12 uses the mechanical energy from shaft 16 to produce electricity, with magnetic fields, in a coaxial arrangement of stators 17 and rotors 19. The electricity exits the electrical rotating machine 12 through one or more voltage lines 18 to supply power to a grid or to power electrical devices. For example, the voltage lines 18 may be high voltage lines that carry voltage in excess of 500 V, 600 V, 700 V, 800 V, 900 V, 1000 V, 1500 V, etc. The voltage line 18 includes one or more central conductors (e.g., copper wires) and an insulative coating (e.g., plastic, rubber coating) to protect each conductor and prevent the loss of charge. In other embodiments, the electrical rotating machine 12 receives electricity through the voltage line 18. The electrical rotating machine 12 uses the electricity to produce magnetic fields in the stators and rotors to drive the shaft 16. Machinery 14 coupled to the shaft 16 is then able to use the torque of the shaft 16 to do work. For example, the machinery 14 may include one or more compressors, pumps, conveyors, cutting tools, and/or industrial equipment.

In operation the non-intrusive capacitive voltage sensor system 10 monitors the input voltage or output voltage of the electrical rotating machine 12 with a controller-monitoring system 20. The controller-monitoring system 20 includes a controller 22 and a monitor 24. The monitor 24 couples to and receives a voltage signal from a non-intrusive capacitive voltage sensor 28. As illustrated, the non-intrusive capacitive voltage sensor 28 couples to the voltage line 18 to detect a voltage at the input or output of the electrical rotating machine 12. The non-intrusive capacitive voltage sensor 28 is capable of sensing a voltage indicative of the voltage in the voltage line 18. More specifically, the non-intrusive capacitive voltage sensor 28 couples to the insulative outer covering of the voltage line 18, thus avoiding costly removal of the insulative covering for direct attachment to the exposed conductor of the voltage line 18. In other words, the sensor 28 is completely external to the insulative outer covering, and thus is described as non-intrusive.

In order to measure changes in the non-intrusive capacitive voltage sensor 28, the monitor 24 may include a voltmeter 30 and/or a voltage measuring circuit 32. For example, the voltmeter 30 and/or voltage measuring circuit 32 may measure the capacitive voltage sensor 28 voltage across a resistor (not shown) between the capacitive voltage sensor 28 and ground. The monitor-controller 24 may use the voltage signals from the non-intrusive capacitive voltage sensor 28 to control operation of the electrical rotating machine 12. For example, the controller 22 may execute instructions in a memory 34 with a processor 36 to block power to and from the electrical rotating machine 12; and increase or decrease power by or delivery to the electrical rotating machine 12. For example, the controller-monitoring system 20 may shutdown machinery 14 (e.g., engine or drive), thereby stopping the rotation of the shaft 16 and generation of power by the electrical rotating machine 12. However, in another embodiment the monitor-controlling system 20 may shutdown power to the electrical rotating machine 12, thereby stopping the rotation of the shaft 16 and operation of the machinery 14.

FIG. 2 is a perspective view of an embodiment of the non-intrusive capacitive voltage sensor 28 coupled to a voltage line 18. As explained above, the voltage line 18 includes a conductor 80, which may be comprised of a plurality of conductive wires 81, surrounded by a protective insulative covering 82 (e.g., plastic, rubber). The protective insulative covering 82 protects the conductor 80 from the environment and isolates the conductor 80 from other electrical conducting articles. The non-intrusive capacitive voltage sensor 28 couples to the voltage line 18 in a non-intrusive manner, thus avoiding costly removal of the protective insulative covering 82 and direct attachment of a voltage sensor to the conductor 80.

In the present embodiment, the non-intrusive capacitive voltage sensor 28 is annular and surrounds the voltage line 18. The non-intrusive capacitive voltage sensor 28 includes a first non-intrusive capacitive voltage sensor 84 and a second non-intrusive capacitive voltage sensor 86. The capacitive voltage sensors 84 and 86 are semi-circular and couple to one another around the voltage line 18 forming a dual or redundant sensor configuration. The capacitive voltage sensors 84 and 86 couple to the controller-monitoring system 20 through respective sensor lines 88 and 90. The sensor lines 88 and 90 carry a voltage signal indicative of the voltage in the conductor 80. The controller-monitoring system 20 is therefore able to measure the change in the voltage over time with the voltage measuring circuit 32 (FIG. 1) or voltage meter 30 (FIG. 1).

FIG. 3 is a cross-sectional view of an embodiment of a non-intrusive capacitive voltage sensor 28. As explained above, the illustrated embodiment of the non-intrusive capacitive voltage sensor 28 includes the first non-intrusive capacitive voltage sensor 84 and the second non-intrusive capacitive voltage sensor 86. The sensors 84 and 86 couple together around the voltage line 18 to sense the voltage in the conductor 80. As illustrated, each of the sensors 84 and 86 have a semi-circular body 92, which extends about 180 degrees around the voltage line 18. However, in different embodiments, the sensors 84 and 86 may cover a different amount of the circumference of the voltage line 18. In still other embodiments, there may be only one non-intrusive capacitive voltage sensor 84 or 86 coupled to a semi-circular member that retains the non-intrusive capacitive voltage sensor on the voltage line 18. As illustrated, the non-intrusive capacitive voltage sensor 28 includes a hinge 100 coupling the sensors 84 and 86 on a first side 94, and a latch 102 coupling the sensors 84 and 86 on a second side 96. The hinge 100 and latch 102 enable the non-intrusive capacitive voltage sensor 28 to couple and decouple around the voltage line 18 by opening and closing. Alternatively the hinge and latch may permanently couple the non-intrusive capacitive sensor around the voltage line 18. The latch 102 may hold the non-intrusive capacitive voltage sensor 28 onto the voltage line 18 by threading a fastener 104 through threaded connectors 106 and 108. In other embodiments, the sensors 84 and 86 may couple together with a drawlatch, spring latch, compression latch, a snapfit mechanism, a hook and loop, a clamp, a strap, or any other removable or permanent coupling.

The capacitive voltage sensors 84 and 86 each include a signal plate 110, shield plate 112 embedded within or between layers of insulating material 114, 116, and 118. The signal plate 110 forms a capacitor with the outer surface 120 of conductor 80 which may be comprised of a plurality of conductive wires 81. As alternating current flows through the voltage line 18, charge increases and decreases in the capacitor (i.e., signal plate 110) creating a voltage (i.e., voltage signal) in sensor line 88, measurable by either the voltmeter 30 (FIG. 1) or the voltage measuring circuit 32 in the controller-monitoring system 20. The voltage in the signal plate 110 may not equal the voltage in the voltage line 18, but is generally indicative of the voltage (e.g., the signal plate voltage enables a determination of the voltage in the voltage line 18 through lookup tables, equations, or calculations, models). The capacitive voltage sensors 84 and 86 include the shield plate 112 to block electromagnetic interference from other electrical sources (e.g., block interference with the signal plate 110 voltage signal). In the present embodiment, the shield plate 112 includes two layers: a magnetic field shield plate 122 to block magnetic field interference, and an electric field shield plate 124 to block electric field interference. The signal plate 110 may be made out of any suitable conductive or semi-conductive material (e.g., copper, aluminum, phosphor bronze, doped silicon). The magnetic field shield plate 122 may be made out of any suitable high-permeability material (e.g., Permalloy, Mu-Metal). The electric field shield plate 124 may be made out of any suitable conductive material (e.g., copper, aluminum, phosphor bronze). As mentioned above, the plates 110, 122, and 124 may be embedded within or between layers of insulative material 114, 116, and 118 (e.g., ceramic, plastic, epoxy, silicon, dielectric insulator). In some embodiments, the material in each of the layers 114, 116, and 118 may be the same insulative material. However, in other embodiments, the material in each of the layers 114, 116, and 118 may differ with respect to one or more of the layers. For example, layer 114 may be made out of dielectric insulator, while layers 116 and 118 are made out of a non-dielectric insulating material. Furthermore, in some embodiments, a layer of insulating material may be placed between the two shield plates 122 and 124.

FIG. 4 is a cross-sectional view of an embodiment of a non-intrusive capacitive voltage sensor 28. In the illustrated embodiment, the non-intrusive capacitive voltage sensor 28 forms a C-shaped or U-shaped body 136 capable of being clipped onto the voltage line 18. In this configuration, the non-intrusive capacitive voltage sensor 28 is able to couple to and be removed from the voltage line without the use of fasteners (e.g., latches, bolts, adhesive clamps), thus, enabling quick installation for measurement and later removal. The non-intrusive capacitive voltage sensor 28 includes insulating material in layers 140, 142, and 144 (e.g., ceramic, plastic, epoxy, doped silicon, dielectric insulator) between the insulation layer 82 of the voltage line 18, signal plate 146, and the shield plate 148. The insulating layers may be made out of a flexible material, enabling the non-intrusive capacitive voltage sensor 28 to resiliently clip onto the voltage line 18 (e.g., the insulating layers may have a spring force). For example, peripheral end portions 138 may be flexed outward in direction 139 during removal and attachment. Moreover, the insulating material in each of the layers 140, 142, and 144 may differ with respect to one another in flexibility. For example, layer 140 may be the most flexible layer creating a tight seal around the insulation layer 82 of the voltage line 18, while the layers 142 and 144 progressively increase in stiffness.

Figure 5:
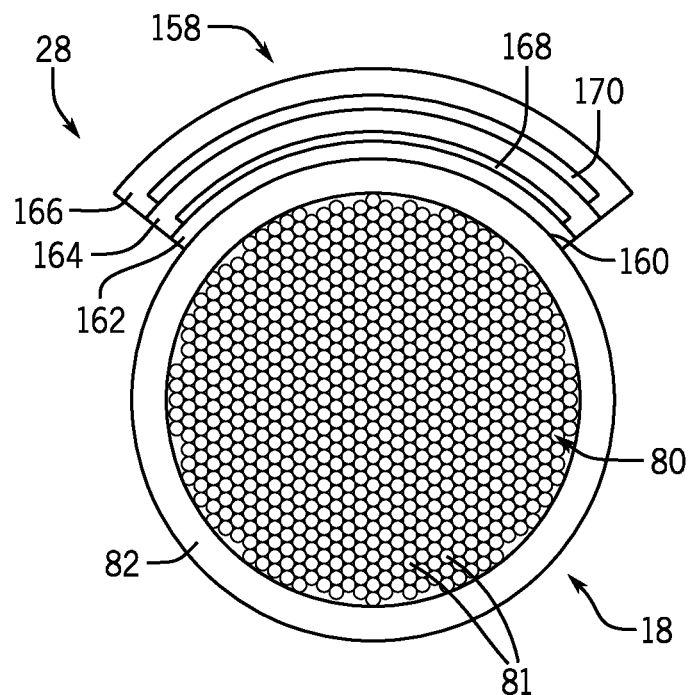
FIG. 5 is a cross-sectional view of an embodiment of a capacitive voltage sensor.

FIG. 5 is a cross-sectional view of an embodiment of a non-intrusive capacitive voltage sensor 28 with an arcuate body 158. In the illustrated embodiment, the non-intrusive capacitive voltage sensor 28 couples to the voltage line 18 with motion-resistant material 160. The motion-resistant material 160 may include an adhesive, a high friction material, surface texture, or any combination thereof. The motion-resistant material 160 may include an elastomer, such as rubber, which may help resist movement of the sensor 28 along a top portion of the voltage line 18. The motion-resistant material 160 may create a permanent or temporary bond with the voltage line 18 depending on the application, thus, enabling short or long term measurement of the voltage in the voltage line 18. The non-intrusive capacitive voltage sensor 28 includes insulating material in layers 162, 164, and 166 (e.g., ceramic, plastic, epoxy, silicon, dielectric insulator) between the signal plate 168 and the shield plate 170. The insulating layers 162, 164, and 166 may be made out of a flexible material, enabling the non-intrusive capacitive voltage sensor 28 to conform to the contour of the voltage line 18. The insulating material in each of the layers 162, 164, and 166 may be the same or differ with respect to one another in flexibility. The ability to adhere the non-intrusive capacitive voltage sensor 28 with a flexible arcuate body 158 directly to the voltage line 18 enables a single non-intrusive capacitive voltage sensor to couple to voltage lines 18 of various diameters.

Figure 6:
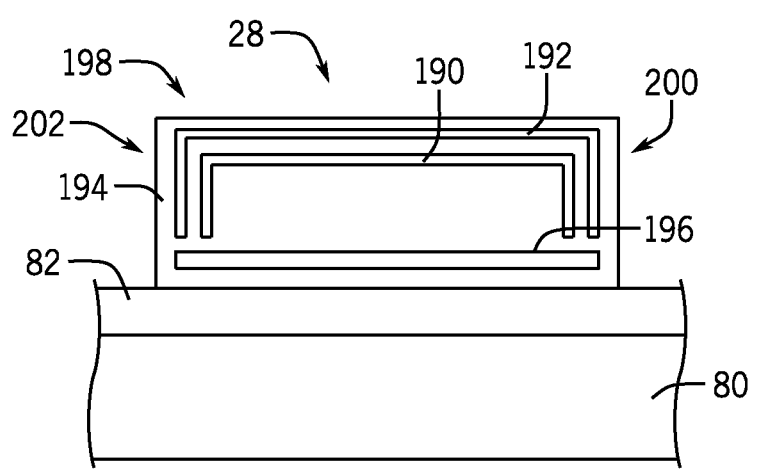
FIG. 6 is a cross-sectional view of an embodiment of a non-intrusive capacitive voltage sensor along line A-A of FIG. 2.

FIG. 6 is a cross-sectional view of an embodiment of a non-intrusive capacitive voltage sensor 28 taken within line A-A of FIG. 2. The non-intrusive capacitive voltage sensor 28 includes shield plates 190 and 192; insulating material 194 (e.g., ceramic, plastic, epoxy, silicon, dielectric insulator) and signal plate 196. For example, the shield plates 190 and 192 may have an outer side 198, a first end side 200, and a second end side 202. The end sides 200 and 202 may be generally crosswise (e.g., perpendicular) to the outer side 198. In this arrangement, the shield plates 190 and 192 reduce external electromagnetic interference with the signal plate 196 while simultaneously reducing interference between the shield plates 190 and 192. More specifically, the end sides 200 and 202 move the outer side 198 of the shield plates 190 and 192 further away from the signal plate 196, to reduce interference between the signal plate 196 and the shield plates 190 and 192. In other embodiments, the shield plates 190 and 192 may be approximately semi-annular in shape.

Figure 7:
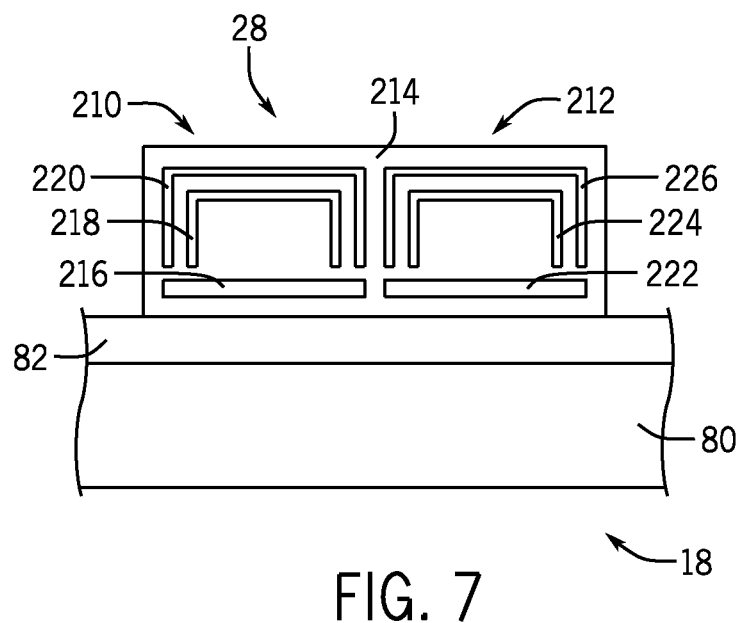
FIG. 7 is a cross-sectional view of an embodiment of a non-intrusive capacitive voltage sensor along line A-A of FIG. 2.

FIG. 7 is a cross-sectional view of an embodiment of a non-intrusive capacitive voltage sensor 28. The non-intrusive capacitive voltage sensor 28 includes a first non-intrusive capacitive voltage sensor 210 and a second non-intrusive capacitive voltage sensor 212. As illustrated, the first and second capacitive voltage sensors 210 and 212 are placed axially adjacent to one another in an insulating material 214 (e.g., ceramic, plastic, epoxy, silicon, dielectric insulator). The first non-intrusive capacitive voltage sensor 210 includes a signal plate 216; and shield plates 218 and 220. The second non-intrusive capacitive voltage sensor 212, similarly, includes a signal plate 222 and shield plates 224 and 226. By including two capacitive voltage sensors 210 and 212, the non-intrusive capacitive voltage sensor 28 provides redundant sensing of the voltage in the voltage line 18 with a single device.

Figure 8:
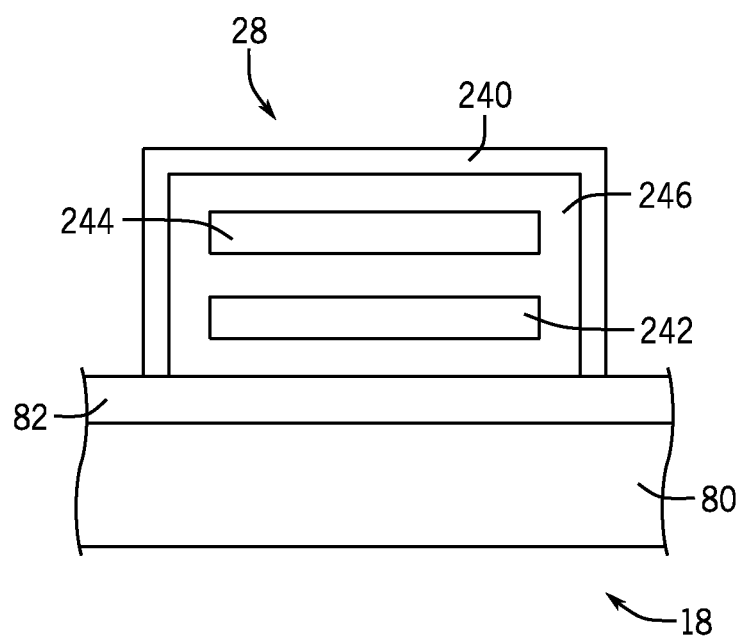
FIG. 8 is a cross-sectional view of an embodiment of a non-intrusive capacitive voltage sensor along line A-A of FIG. 2.

FIG. 8 is a cross-sectional view of an embodiment of a non-intrusive capacitive voltage sensor 28. The non-intrusive capacitive voltage sensor 28 includes a housing 240, a signal plate 242, shield plate 244, and insulating material 246 (e.g., ceramic, plastic, epoxy, doped silicon, dielectric insulator). As illustrated, the insulating material 246, signal plate 242, and shield plate 244 rest within the housing 240. As discussed above, the non-intrusive capacitive voltage sensor 28 includes the shield plate 244 that blocks electromagnetic interference from interfering with the voltage signal sensed by the signal plate 242. As illustrated, the shield plate 244 may only block electromagnetic interference on one side of the signal plate. Moreover, the shield plate 244 may be made out of one or more materials capable of blocking electric and magnetic fields. However, in some embodiments the housing 240 and shield plate 244 may work together to block electromagnetic interference. For example, the shield plate 244 may block magnetic fields while the housing 240 blocks electric fields, or vice versa.

Technical effects of the invention include the ability to non-intrusively sense voltage in a voltage line. For example, the non-intrusive capacitive voltage sensor may non-intrusively attach (e.g., without removing or piercing the insulation) to the voltage line with an adhesive, a clip, a latch, a clamp, a strap, or other removable or permanent mount. Accordingly, the non-intrusive capacitive voltage sensor reduces the time and cost associated with monitoring voltage on a voltage line. When coupled to the voltage line the non-intrusive capacitive voltage sensor enables a control-monitoring system to detect changes in voltage over time.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:
   a non-intrusive capacitive voltage sensor configured to couple to an insulator surrounding a metal conductor, wherein the non-intrusive capacitive voltage sensor is configured to produce a voltage signal indicative of a voltage in the metal conductor, the non-intrusive capacitive voltage sensor, comprising:
      an arcuate body comprising separation between two peripheral end portions of the body, wherein the separation is configured to enable the body to couple to the insulator in a lateral direction relative to an axis of the metal conductor, wherein the body is configured to extend circumferentially along a surface of the insulator;
      a signal plate configured to create a capacitor with an outer surface of the metal conductor;
      a magnetic shield plate configured to block magnetic field interference with the signal plate;
      an electric shield plate configured to block electric field interference with the signal plate, wherein the electric shield plate is separate from the magnetic shield plate; and
      insulating material disposed between the signal plate and the magnetic shield plate;
      wherein the arcuate body, the signal plate, the insulating material, the magnetic shield, and the electric shield are coupled together; and
   a monitor-controller system configured to receive the voltage signal from the non-intrusive voltage sensor, wherein the monitor-controller system is configured to use the voltage signal to monitor or control a machine.

2. The system of claim 1, wherein the monitor-controller system comprises a voltmeter configured to measure the voltage signal from the non-intrusive capacitive voltage sensor.

3. The system of claim 1, wherein the monitor-controller system comprises a voltage measuring circuit configured to measure the voltage signal from the non-intrusive capacitive voltage sensor.

4. The system of claim 1, wherein the magnetic shield plate and the electric shield plate extend along the signal plate.

5. The system of claim 4, wherein the an insulating material extends along the signal plate, the magnetic shield plate, and the electric shield plate.

6. The system of claim 1, wherein the non-intrusive capacitive voltage sensor is configured to decouple from the insulator.

7. The system of claim 1, wherein the arcuate body is configured to couple to the insulator with a motion-resistant material.

8. A system, comprising:
   a first non-intrusive capacitive voltage sensor configured to output a first voltage signal indicative of a voltage in a metal conductor comprising:
      a first body portion comprising a curved inner surface;
      a first signal plate configured to sense the voltage in the metal conductor;
      a first insulating material extending over the first signal plate; and
      a first shield plate extending over the first insulating material, wherein the first shield plate is configured to block electromagnetic interference
      wherein the first body portion, the first signal plate, the first insulating material, and the first shield plate are coupled together; and
   a second non-intrusive capacitive voltage sensor configured to output a second voltage signal indicative of the voltage in the metal conductor comprising:
      a second portion comprising a curved inner surface;
      a second signal plate configured to sense the voltage in the metal conductor;
      a second insulating material extending over the second signal plate; and
      a second shield plate extending over the second insulating material, wherein the second shield plate is configured to block electromagnetic interference;
      wherein the second body portion, the second signal plate, the second insulating material, and the second shield plate are coupled together;
   wherein the first non-intrusive capacitive voltage sensor is configured to couple to the second non-intrusive capacitive voltage sensor around an insulator surrounding the metal conductor in a lateral direction relative to an axis of the metal conductor;
   wherein the first and second voltage signals are independently indicative of the voltage in the metal conductor.

9. A system, comprising:
   a non-intrusive capacitive voltage sensor configured to output a voltage signal to a monitor, wherein the voltage signal is indicative of a voltage in a metal conductor, the non-intrusive capacitive voltage sensor comprising:
      a body configured to extend only partially along a surface of an insulator surrounding the metal conductor, wherein the body comprises separation between two peripheral end portions of the body, wherein the separation is configured to enable the body to couple to the insulator in a lateral direction relative to an axis of the metal conductor;

a signal plate configured to sense the voltage in the metal conductor by forming a capacitor with an outer surface of the metal conductor;

a shield plate extending over the signal plate, wherein the shield plate is configured to block electromagnetic interference; and an insulating material at least partially surrounding the signal plate and the shield plate, wherein the insulating material is disposed between the signal plate and the shield plate; wherein the insulating material is configured to couple directly to an insulator surrounding the metal conductor;

wherein the body, the signal plate, the shield plate, and the insulating material are coupled together.

10. The system of claim 9, wherein the signal plate and the shield plate are embedded in the insulating material.

11. The system of claim 9, wherein the shield plate comprises a magnetic field shield plate and an electric field shield plate.

12. The system of claim 9, wherein the non-intrusive capacitive voltage sensor comprises a curved signal plate and a curved shield plate.

13. The system of claim 1, wherein the magnetic shield plate is between the signal plate and the electric shield plate.

14. The system of claim 1, wherein a layer of the insulating material separates the magnetic shield plate from the electric shield plate.

15. The system of claim 1, wherein the arcuate body is configured to clip on to the insulator, wherein the body is coupled to the insulator without using a fastener.

16. The system of claim 15, wherein an arc formed by the arcuate body comprises more than 180 degrees.

17. The system of claim 1, wherein the arc formed by the arcuate body comprises less than or equal to 180 degrees.

18. The system of claim 8, comprising one or more fasteners removably coupling together the first non-intrusive capacitive voltage sensor and the second non-intrusive capacitive voltage sensor.

19. The system of claim 8, wherein the first non-intrusive capacitive voltage sensor and the second non-intrusive capacitive voltage sensor are coupled together by a rotatable coupling and a removable coupling on opposite first and second sides.

20. The system of claim 8, wherein the first body portion comprises an inner surface that is semi-circular and the second body portion comprises an inner surface that is semi-circular.

* * * * *